United States Patent [19]
Krut et al.

[11] Patent Number: 5,391,236
[45] Date of Patent: Feb. 21, 1995

[54] PHOTOVOLTAIC MICROARRAY STRUCTURE AND FABRICATION METHOD

[75] Inventors: Dmitri D. Krut, Encino; Denise E. Michaels, Northridge; B. Terence Cavicchi, North Hollywood, all of Calif.

[73] Assignee: Spectrolab, Inc., Sylmar, Calif.

[21] Appl. No.: 99,756

[22] Filed: Jul. 30, 1993

[51] Int. Cl.[6] .................... H01L 31/05; H01L 31/18
[52] U.S. Cl. .................... 136/249; 437/2; 437/5; 437/51; 437/64; 437/67; 437/205
[58] Field of Search .......... 136/249 MS; 437/2-5, 437/51, 64-65, 67, 205

[56] References Cited

U.S. PATENT DOCUMENTS

| | | | |
|---|---|---|---|
| 4,042,418 | 8/1977 | Biter | 136/249 MS |
| 4,110,122 | 8/1978 | Kaplow et al. | 136/249 MS |
| 4,156,309 | 5/1979 | Routh et al. | 437/2 |
| 4,278,473 | 7/1981 | Borden | 136/249 MS |
| 4,330,680 | 5/1982 | Goetzberger | 136/247 |
| 4,612,408 | 9/1986 | Moddell et al. | 136/244 |

*Primary Examiner*—Aaron Weisstuch
*Attorney, Agent, or Firm*—Georgann S. Grunebach; Terje Gudmestad; W. K. Denson-Low

[57] ABSTRACT

A photovoltaic microarray such as a solar cell array is monolithically fabricated, without a supporting substrate, by forming a network of trenches from one side of a substrate to define separate cell areas, filling the trenches with an insulative filler material that adheres to the substrate material and provides structural integrity, and then trenching from the opposite side of the substrate to provide an air gap insulation network between adjacent cells. Series connections are provided between adjacent cells by connecting the front surface of one cell over the filler material to the bulk semiconductor for the next cell, with the connection completed through the bulk semiconductor itself to back electrodes for each cell.

30 Claims, 2 Drawing Sheets

PHOTOVOLTAIC MICROARRAY STRUCTURE AND FABRICATION METHOD

BACKGROUND OF THE INVENTION

1. Field of the Invention

This invention relates to solar cell structures and other light sensing devices and fabrication techniques, and more particularly to compact, low weight high voltage light sensitive devices and a related fabrication method that is compatible with a wide range of cell materials.

2. Description of the Related Art

It is generally desirable to use monolithic fabrication techniques in forming solar cell arrays, in which a basic cell is replicated over a unitary structure. Monolithic fabrication provides a low cost, high volume manufacturing capability, and a high quality array. Such an array is shown in U.S. Pat. No. 4,278,473 to Borden. The Borden patent describes solar cell arrays, in this case monolithic, of which the individual cells are formed on a common semi-insulating substrate and interconnected with each other. In the Borden patent, a pair of epitaxial layers are formed on the common substrate to provide the active cell material. Breaks are made in the two epitaxial layers to electrically isolate the cells from each other, with the semi-insulating substrate continuing to provide a common carrier for all of the cells. To connect adjacent cells in series, electrical leads are connected from the upper surface of one cell to a contact ledge on the side of the base epitaxial region for an adjacent cell, following the contours of the break between the two cells.

Although a monolithic fabrication process such as that used in the Borden patent is a definite improvement over discrete fabrication, to date the required semi-insulating substrates are available only for gallium arsenide. Silicon and germanium are common solar cell materials that are less expensive than gallium arsenide, but they have not been found to be compatible with monolithic fabrication techniques. Even with monolithic gallium arsenide construction, it would desirable to further reduce the cost and bulk of the resulting photovoltaic arrays.

SUMMARY OF THE INVENTION

The present invention seeks to provide a monolithic fabrication method for photovoltaic arrays that is compatible with silicon, germanium and other conductive substrates, as well as with gallium arsenide and other Group III-V materials, and yields lower cost and more compact arrays. The invention is applicable to power generating devices in which power outputs from basic cells are accumulated, such as solar cells and power converters for fiber optic control systems, as well as to other devices that respond to received light through the photovoltaic effect to produce an output signal, such as on/off switches.

These goals are achieved with a monolithic fabrication technique that eliminates the need for a semi-insulating substrate. In the solar cell application a semiconductor substrate, preferably a standard wafer, is provided with a pn solar cell junction adjacent its front surface. A network of isolation trenches is formed partially through the substrate, preferably by saw cutting, to define an array of solar cells. The isolation trenches are then filled with an insulative filler material, preferably a polyimide, that adheres to the substrate on both sides of the trenches and provides structural integrity. Another set of isolation trenches is cut in from the opposite face of the substrate to meet the filler material. In this manner the individual cells are isolated from each other by barriers that are partially filled and partially air gaps. The second set of trenches could also be provided with a filler material, but this is not necessary.

To obtain a series connection between successive cells, one set of trenches is formed as an outer contact trench that is relatively wide and shallow, and an inner isolating trench that is narrower and deeper. The isolating trench is filled with an insulating material, leaving a lateral portion of the contact trench exposed. A contact is then made from the front side of an adjacent cell, over the filler material, to the bulk substrate of the other cell exposed by the contact trench. The dimensions of the substrate and exposed trench area are selected to establish a low resistance path from the contact to the back surface of the cell, thus providing a series connection between the front of one cell and the back of the adjacent cell. A back sheet electrode can be provided on the adjacent cell to reduce series resistance over its entire back surface area.

In the preferred embodiment, the connection between the front contact of one cell and the bulk semiconductor of the adjacent cell is formed by a surface metallization. The contact trench has a preferred width of about 100-500 microns lateral to the isolating trench, the isolating trench has a preferred width of about 25-100 microns, and the collective depth of the isolating and contact trenches is about half the substrate thickness of about 150-200 microns.

The filler network provides a high degree of mechanical strength for the array, without a semi-insulating substrate. The elimination of the additional substrate removes the prior restriction to gallium arsenide, and also reduces the cost and bulk of the overall array.

These and further features and advantages of the invention will be apparent to those skilled in the art from the following detailed description, taken together with the accompanying drawings.

DETAILED DESCRIPTION OF THE INVENTION

Figure 1A:
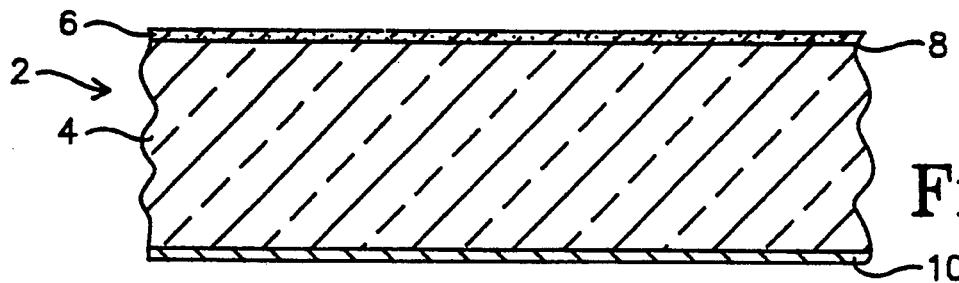
FIGS. 1a-1g are fragmentary sectional views illustrating a fabrication sequence for a solar cell array in accordance with the invention.

Referring first to FIG. 1a, a portion of a semiconductor wafer 2 is shown that has been treated to function as a photovoltaic device. It consists of a bulk semiconductor material 4 such as silicon, germanium, or gallium arsenide. The front portion of the substrate has a layer 6 that is doped to a conductivity opposite to that of the bulk semiconductor by a conventional technique such as diffusion, implantation, or epitaxial growth, thus forming a pn junction 8. The back of the substrate is shown coated with a metallization layer 10 that functions as a conductive back electrode; the back electrode can alternately be applied at a later stage in the processing, as described below. The back contact is preferably gold/nickel/silver for a germanium device, and aluminum/titanium/palladium/silver for a silicon device. It can also be formed by doping the substrate, or by a combination of metal and doped semiconductor layers.

The fundamental operating principle of the solar cell can be illustrated by describing the operation of a silicon device. The bulk semiconductor 4 consists of pure silicon, to which a trace amount of a Group V element such as phosphorous has been added to make it an n-type semiconductor, with electric current carried by free electrons. Each phosphorous atom contributes one free electron, leaving behind the phosphorous atom bound to the crystal structure with a unit positive charge. Similarly, a trace amount of a Group III element such as boron is diffused or otherwise implanted into the front layer 6 to form a p-type semiconductor there, with the electric current carried by free holes. Each boron atom contributes one hole, leaving behind a boron atom with a unit negative charge.

The opposite dopings of the bulk semiconductor 4 and front layer 6 produce the pn junction 8. The fixed charges at this junction, due to the bound boron and phosphorous atoms, create a permanent-dipole charge layer with a high electric field. When photons of light energy from the sun produce electron-hole pairs near the junction, the built-in electric field forces the holes to the p side (the front), and the electrons to the n side (the back). This displacement of free charges results in a voltage differential between the two regions of the crystal, the p region being plus and the n region minus. This voltage differential can be used to provide electric power to a load.

Figure 1B:
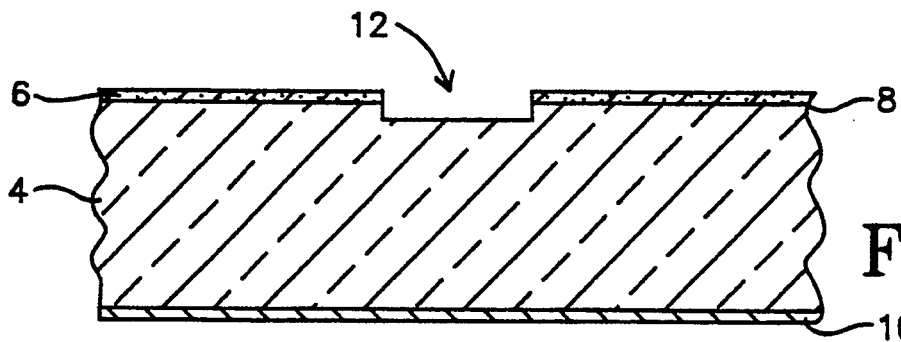

In the next step of the fabrication process, illustrated in FIG. 1b, a trench 12 that is relatively wide and shallow is formed on the front side of the substrate to provide for electrical contact. This trench extends beyond the junction 8 to the bulk semiconductor 4. It is preferably formed by saw cutting with a conventional dicing machine, although other techniques such as etching could also be used.

Figure 1C:
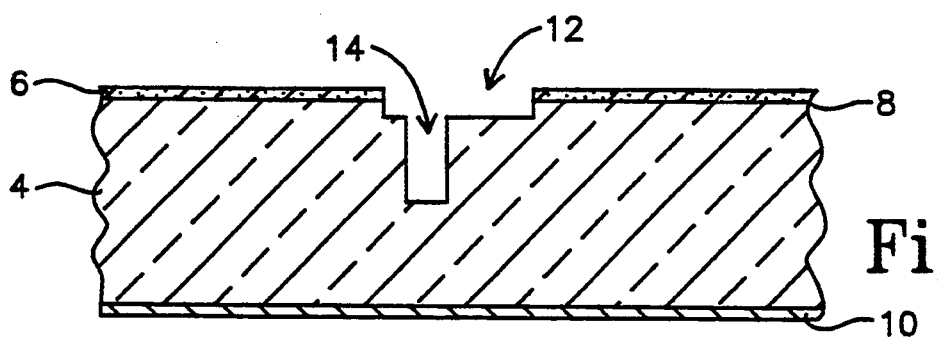

A narrower and deeper inner isolating trench 14 is extended further into the bulk semiconductor from the floor of the outer trench 12 (FIG. 1c). The cumulative depth of the inner and outer trenches is typically roughly half of the total substrate thickness. With a usual substrate thickness of about 150-200 microns, the total trench depth would typically be on the order of 75-100 microns, with the outer trench accounting for about 5-10 microns of the total depth. The trench 14 is used to provide electrical isolation between solar cells on either side, as described below.

Figure 1D:
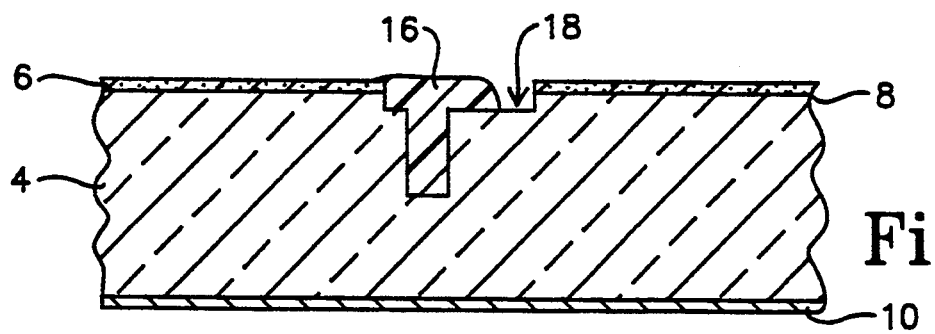

In the next step, illustrated in FIG. 1d, the inner trench and the adjacent portion of the outer trench are filled with an insulative filler material 16 that securely adheres to the substrate material on both sides. The insulating filler is preferably a polyimide, which exhibits a strong adherence to the substrate, a good thermal match with semiconductor materials, thermal stability, and ease of processing. Other electrical insulators such as thick film glasses, acrylics, and adhesives could also be used.

Figure 1E:
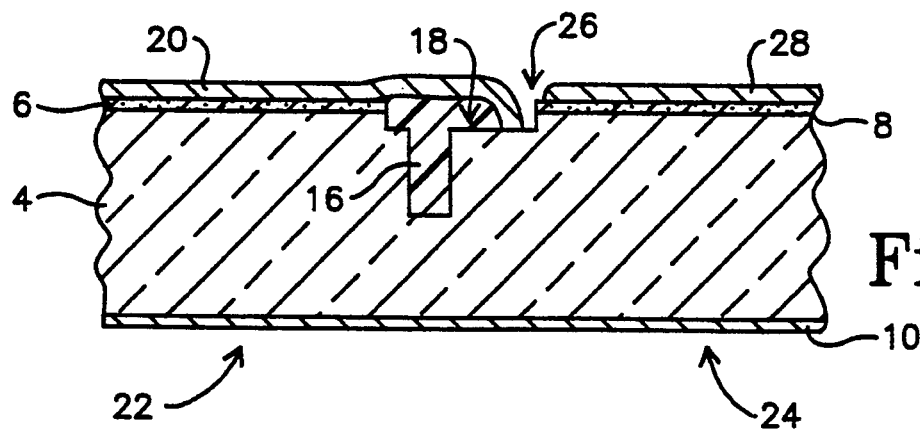

The polyimide filler is patterned, preferably by photolithographic techniques, to leave a lateral portion 18 of the contact trench exposed. In the next step, illustrated in FIG. 1e, a metallization is applied over the front surface of the substrate to form high voltage circuit interconnections, followed by sintering. The metallization layer 20 shown on the left hand side of the substrate overlies the diffused, implanted, or epitaxial region 6 in this area, and extends over the adjacent filler into the lateral exposed portion of the outer trench. This metallization layer functions as a contact lead between the front side of the substrate for the solar cell 22 on the left side of the figure, and the back contact for the solar cell 24 on the right side of the figure. A gap 26 is deliberately patterned between metallization layer 20 and the next metallization layer 28 over the front surface of the adjacent solar cell 24. Standard photolithographic techniques are used for this purpose.

The metallization material is preferably the same as for the back electrode 10. For silicon, an alternate two-step metallization process can be used, with aluminum/titanium/palladium/silver contacting the higher resistivity base material exposed by the trench, and titanium/palladium/silver contacting the upper surface of the diffused area. An anti-reflection coating is preferably applied to the light sensing portion of the front surface.

Since the substrate is relatively thin, the semiconductor material immediately below the lateral portion 18 of the outer trench forms a conductive path between the contact lead 20 and the back electrode sheet 10. With a GaAs/Ge solar cell, in which the germanium is a very low resistivity material (about 0.02 ohm-cm), the contact trench need only be about 100-250 microns wide lateral to the isolating trench. In the case of GaAs or silicon, 2 ohm-cm or lower resistivity material should be used; the lateral trench area would preferably be about 250-500 microns wide lateral to the isolating trench for a substrate thickness of about 150-200 microns.

Since the cells are much wider than they are thick, there can be too much resistance to a lateral spreading of the signal from the contact lead 20 through the base of the cell via the bulk semiconductor material. The segmented back electrodes spread the current from the previous cell over a given cell's entire back surface area. The back metallization has the effect of reducing the otherwise high lateral resistance which results from the thin, large area of the device.

Figure 1F:
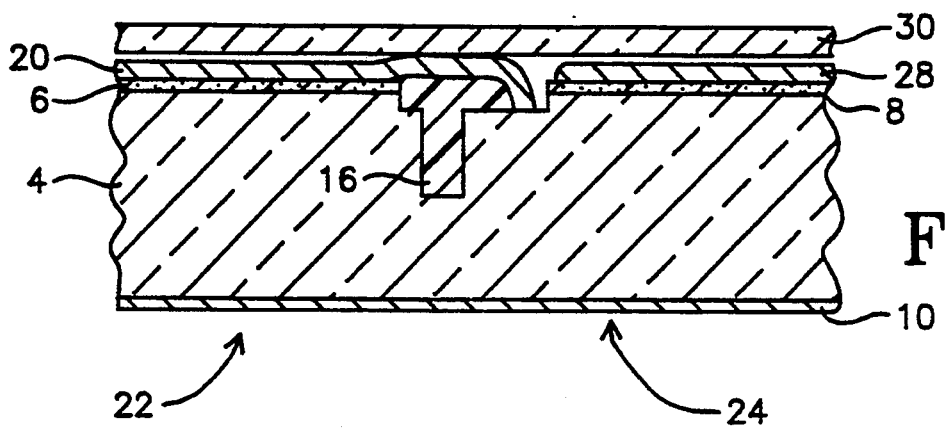
Figure 1G:
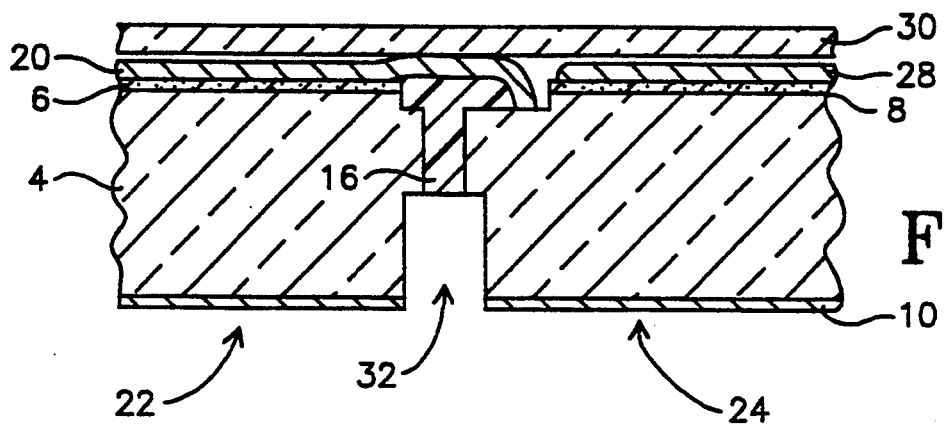

In the next step, illustrated in FIG. 1f, an optional protective cover glass is secured over the front of the assembly with an adhesive. Next, a third array of trenches 32 is saw cut in from the back of the substrate in alignment with the isolating trenches 14, to a depth at which they meet the lower ends of the isolating trenches. This establishes an air gap insulation between the lower portions of the adjacent solar cells 22 and 24, while the filler material insulates the upper portions of the two cells from each other. The back trenches 32 are preferably, but not necessarily, wider than the isolation trenches 14. The cutting operation to establish the third trenches 32 also cuts through the back electrode 10, dividing it into separate electrodes for each separate cell.

Except for the addition of front and back contact tabs for the terminal cells, the photovoltaic array is now complete. The filler material 16 provides a strong bond that securely holds the different cells together, even when the lower trenches 32 are left open, without the need for any common substrate underlying the individual cells. Series connections are made from the front contact for each cell to the back contact for the adjacent cell via the contact leads 20 and the portions of the bulk semiconductor between these contact leads and the back sheet electrodes.

Figure 2:
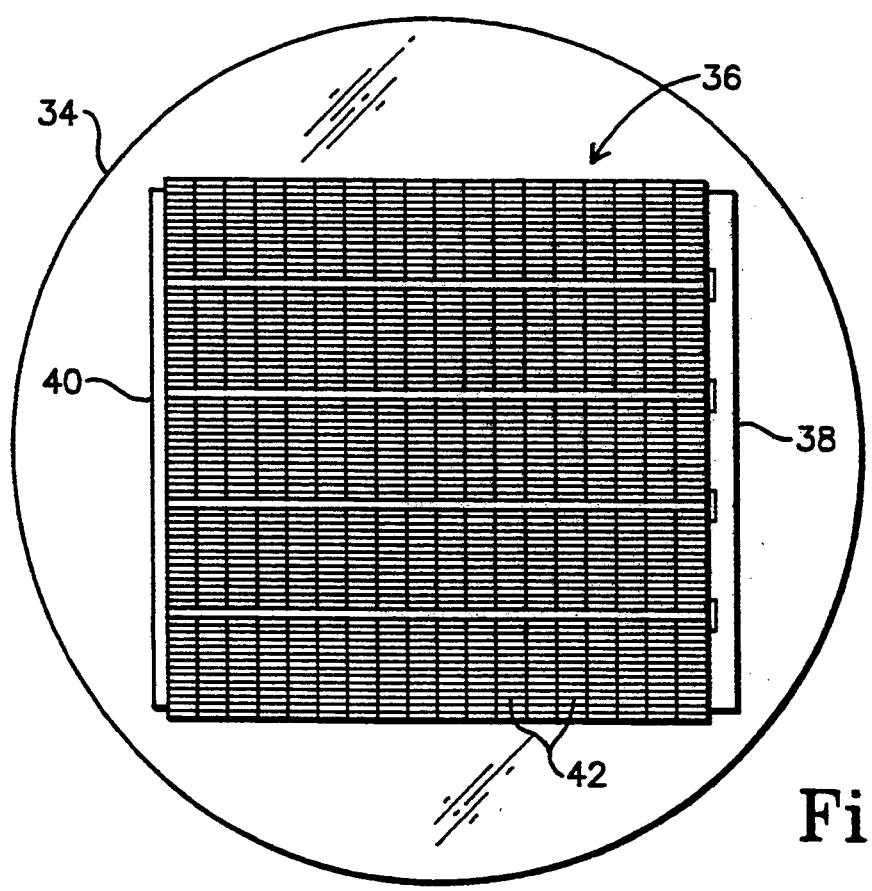
FIG. 2 is a plan view of a photovoltaic array fabricated from a single semiconductor wafer in accordance with the invention.

A complete photovoltaic array is shown in FIG. 2. It is most conveniently formed from a standard 10 cm diameter wafer, indicated by reference number 34. After the front metallization and antireflective coating have been applied, the peripheral portions of the wafer are cut away, leaving the array 36. After the rear trenches 32 have been cut, the front contact tabs 38 are welded or soldered on to provide external contact to the top of the array, and back side interconnect tabs 40 are added. A typical array consists of a 5×18 cell matrix, with a 7×7 cm dimension. The individual cells 42 in the rows of the array illustrated in FIG. 2 are connected in series, and the rows are connected in parallel. Isolating trenches similar to those used for the individual cells would normally be provided between the parallel rows.

While a particular embodiment of the invention has been shown and described, numerous variations and alternate embodiments will occur to those skilled in the art. For example, wire bond, wrap-around, metal foil, or air bridge contacts can be used for the series connections between adjacent cells, rather than the monolithic metallization approach described above. Furthermore, the filler material used to hold the array together might be provided towards the back or middle of the trench network rather than the front, or it could extend all the way from front to back. Accordingly, it is intended that the invention be limited only in terms of the appended claims.

We claim:

1. A method of forming a pair of mutually isolated photovoltaic cells at a pair of adjacent cell areas on a bulk semiconductor substrate, said substrate having a pn junction adjacent its front side, comprising:
   forming substrate contacts to said cell areas,
   forming a first trench that extends partially into the substrate from one side between said solar cell areas,
   filling said first trench with an insulative filler material that adheres to the substrate on both sides of the first trench,
   forming a second trench into the substrate from its opposite side to form an insulating continuum with said filler material between said cell areas, and
   forming front contacts to said cell areas.

2. The method of claim 1, wherein said first trench is formed from the front side of the substrate and said second trench is formed from the rear side of the substrate.

3. The method of claim 2, wherein said second trench is left open at the completion of said cells.

4. The method of claim 2, wherein the substrate contacts to said cell areas are established by forming electrodes over the back surface of the substrate at said cell areas, and forming electrical connectors to the bulk semiconductor from the front side of the substrate, said connectors electrically communicating with respective back electrodes through the bulk semiconductor.

5. The method of claim 4, wherein said first trench is formed by forming a relatively wide and shallow outer trench from the front side of the substrate to the bulk semiconductor, and a narrower and deeper inner trench from the outer trench into the substrate, Said filling step comprises filling said inner trench with said filler material while leaving a lateral portion of said outer trench on one side of the inner trench unfilled, and said electrical connector for one cell of said pair is formed on said one side of the inner trench at said unfilled lateral portion of the outer trench.

6. The method of claim 5, wherein the front contact for the other of said pair of cells is formed by applying a metallization layer over its front surface, said metallization layer extending over said filler material to form said electrical connector for said one cell.

7. The method of claim 5, wherein said outer trench is formed with a width of about 100–500 microns lateral to the inner trench, and said inner trench is formed with a width of about 25–100 microns.

8. The method of claim 2, wherein said first trench is formed to a depth of about half the substrate thickness.

9. The method of claim 8, wherein said substrate is about 150–200 microns thick and said first trench is about 75–100 microns deep.

10. The method of claim 2, wherein said trenches are formed by saw cutting.

11. A method of forming a photovoltaic cell array on a bulk semiconductor substrate that has a pn junction adjacent its front side, comprising:
    providing an electrode over the back of the substrate,
    forming a pattern of relatively wide and shallow outer trenches in the bulk semiconductor from the front side of the substrate, said array of outer trenches dividing the substrate into separate cell areas,
    forming narrower and deeper inner trenches from said outer trenches into the substrate,
    filling said inner trenches with an insulative filler material that adheres to the substrate on both sides of the inner trench, leaving lateral portions of said outer trenches exposed,
    forming front contacts to the front substrate surface within said cell areas,
    electrically connecting the front contacts of at least some of said cells to the exposed portions of the outer trenches of adjacent cells, thereby establishing electrical connections between said front contacts and the back electrode of said adjacent cells through the bulk semiconductor, and
    forming a pattern of back trenches into the substrate from its back side in alignment with, and extending to, said filled inner trenches to electrically isolate adjacent cells from each other.

12. The method of claim 11, wherein said front contacts are connected to the exposed portions of the outer trenches of adjacent cells by forming patterned metallization layers over the front surfaces of respective cells, said metallization layers extending over adjacent filled inner trenches and the exposed portions of the outer trenches of said adjacent cells.

13. The method of claim 12, wherein said outer trenches are formed with a width of about 100–500 microns lateral to the inner trench, and said inner trenches are formed with a width of about 25–100 microns.

14. The method of claim 11, wherein said inner and outer trenches are formed to a collective depth of about half the substrate thickness.

15. The method of claim 14, wherein said substrate is about 150–200 microns thick, and the collective depth of said inner and outer trenches is about 75–100 microns.

16. The method of claim 11, wherein said trenches are formed by saw cutting.

17. A photovoltaic cell array, comprising:
    a bulk semiconductor substrate having a photovoltaic front side and a back side;

a network of trenches extending through said substrate between said front and back sides and dividing said substrate into an array of separate cells, said photovoltaic front side of the substrate including a photosensitive pn junction that extends in a single plane substantially continuously across said array, interrupted substantially only by said trenches, with said trenches positioned between and lateral to the pn junctions of adjacent cells;

an insulative filler material filling at least a portion of said trenches, said filler material adhering to the substrate material on both sides of said trenches to maintain the mechanical integrity of said substrate; and respective back electrodes on the back side surfaces of said cells generally parallel to said pn junction.

18. The array of claim 17, said filler material comprising a polyimide.

19. A photovoltaic cell array, comprising:

a bulk semiconductor substrate having a photovoltaic front side;

a network of trenches extending through said substrate between its front and back sides and dividing said substrate into separate cells, and an insulative filler material extending to a depth of approximately half the substrate thickness and filling a portion of said trenches, said filler material adhering to the substrate material on both sides of said trenches to maintain the mechanical integrity of said substrate.

20. The array of claim 19, wherein said substrate is about 50–200 microns thick and said filler material extends to a depth of about 75–100 microns.

21. A photovoltaic cell array, comprising:

a bulk semiconductor substrate having a photovoltaic front side;

a network of trenches extending through said substrate between its front and back sides and dividing said substrate into separate cells, said trenches comprising relatively wide and shallow outer trenches that extend into the substrate from its front side, relatively narrow and deeper inner trenches that extend into the substrate from said outer trenches, and back trenches that extend into the substrate from its back side and meet said inner trenches, and an insulative filler material filling at least a portion of said trenches, said filler material adhering to the substrate material on both sides of said trenches to maintain the mechanical integrity of said substrate.

22. The array of claim 21, wherein said inner trenches are filled with said filler material and said back trenches are open.

23. The array of claim 22, wherein said back trenches are wider than said inner trenches.

24. The array of claim 21, wherein portions of said outer trenches lateral to said inner trenches are exposed, back electrodes are formed over the back sides of said cells, and electrical connectors are provided between the front sides of said cells to the bulk semiconductor exposed in said lateral outer trench areas for adjacent cells, said electrical connectors together with the bulk semiconductor providing electrical connection paths between the front sides and the back electrodes of adjacent cells to connect said cells in series.

25. The array of claim 24, said electrical connectors comprising respective metallization layers that overlie the front sides of said cells and extend over said filled trenches to the lateral outer trench areas for adjacent cells.

26. The array of claim 21, wherein said outer trenches are about 100–500 microns wide lateral to the inner trench, and said inner trenches are about 25–100 microns wide.

27. A monolithic photovoltaic structure, comprising:

a bulk semiconductor substrate having a photosensitive planar pn junction at its front side surface that extends across at least first and second cell areas of said substrate's front surface, a front contact electrode on said first cell area, a shaped trench in said front substrate surface forming a shelf in said bulk semiconductor lateral to said front electrode and below the level of said pn junction, a back contact lead connected to said exposed bulk semiconductor shelf in said trench, and a back contact electrode on the substrate's back surface in alignment with said front electrode for the first cell and said back contact lead, said second cell area located on the other side of said trench and electrically isolated from said first cell area by said trench, said second cell area including a front contact electrode over its front surface, the resistance of said bulk semiconductor between the back contact lead and said back contact electrode being low enough to provide a contact path between said back contact lead and said back contact electrode, with the back contact lead for the first cell area electrically connected to the front contact electrode for the second cell area to connect said two cell areas in series.

28. The structure of claim 27, said back contact lead for the first cell and said front contact electrode for the second cell comprising a continuous metallization layer.

29. The structure of claim 27, said bulk semiconductor substrate comprising silicon or gallium arsenide, wherein said substrate is about 150–200 microns thick and said back contact lead extends over a width of about 250–500 microns along said trench.

30. The structure of claim 27, said bulk semiconductor comprising gallium arsenide/germanium, wherein said substrate is about 150–200 microns thick and said back contact lead extends over a width of about 100–250 microns along said trench.

* * * * *